United States Patent [19]

Nguyen

[11] Patent Number: 5,028,548
[45] Date of Patent: Jul. 2, 1991

[54] METHOD OF MANUFACTURING A PLANAR SEMICONDUCTOR DEVICE HAVING A GUARD RING STRUCTURE

[75] Inventor: Minh-Chau Nguyen, Caen, France

[73] Assignee: U.S. Philips Corp., New York, N.Y.

[21] Appl. No.: 544,809

[22] Filed: Jun. 26, 1990

Related U.S. Application Data

[63] Continuation of Ser. No. 383,306, Jul. 18, 1989, abandoned, which is a continuation of Ser. No. 147,099, Jan. 20, 1988, abandoned, which is a continuation of Ser. No. 846,165, Mar. 31, 1986, abandoned.

[30] Foreign Application Priority Data

Apr. 26, 1985 [FR] France .................. 85 06410

[51] Int. Cl.$^5$ ............................................. H01L 21/04
[52] U.S. Cl. ............................ 437/15; 437/75; 437/904; 437/7; 437/8; 148/DIG. 13; 148/DIG. 70; 357/52
[58] Field of Search ................... 437/15, 904, 75; 148/DIG. 13, DIG. 70

[56] References Cited

U.S. PATENT DOCUMENTS

| | | |
|---|---|---|
| 3,971,061 | 7/1976 | Matsushita et al. ............... 357/38 |
| 3,978,511 | 8/1976 | Digoy ................................ 357/52 |
| 4,573,064 | 2/1986 | McLevige et al. ................ 357/90 |
| 4,573,066 | 2/1986 | Whight ............................. 357/52 |
| 4,594,602 | 6/1986 | Iimura et al. ..................... 357/90 |

FOREIGN PATENT DOCUMENTS

| | | | |
|---|---|---|---|
| 0115093 | 8/1984 | European Pat. Off. ............ 357/52 |
| 3338718 | 4/1984 | Fed. Rep. of Germany ....... 357/52 |
| 60-12859 | 3/1985 | Japan ............................... 357/52 |

Primary Examiner—Brian E. Hearn
Assistant Examiner—Linda J. Fleck
Attorney, Agent, or Firm—Steven R. Biren

[57] ABSTRACT

A method of manufacturing a semiconductor device of the "planar" type comprising a highly doped substrate having a doping concentration $c_o$ and an epitaxial surface layer having a carrier concentration $c < c_o$, in which are formed a main pn junction having a depth $x_j$ and a structure of floating guard rings. According to the invention, this device also includes between the substrate and the epitaxial surface layer, a second epitaxial layer having a carrier concentration $c'$ such that $c_o > c' > c$. This permits the production of devices with different maximum operating voltages using the same configuration of guard rings.

2 Claims, 1 Drawing Sheet

METHOD OF MANUFACTURING A PLANAR SEMICONDUCTOR DEVICE HAVING A GUARD RING STRUCTURE

This is a division of application Ser. No. 383,306, filed July 18, 1989 which is a continuation of Ser. No. 147,099 filed Jan. 20, 1988 which is a continuation of Ser. No. 846,165 filed Mar. 31, 1986, all now abandoned.

BACKGROUND OF THE INVENTION

The invention relates to a semiconductor device comprising a substrate of a first conductivity type having a high doping concentration $c_o$, a first epitaxial surface layer of said first conductivity type and having a lower doping concentration $c < c_o$, a surface adjacent zone of the second conductivity type opposite to the first conductivity type forming with said epitaxial surface layer a main planar pn junction having over the major part of its area a junction depth $x_j$, and a structure of floating guard rings of said second conductivity type.

It also relates to a class of devices of the kind described above, each device of the class being defined by a maximum operating voltage V. Finally, the invention relates to a method of manufacturing such a class of devices.

The invention can be very advantageously used in the field of devices such as rectifier diodes, field effect transistors, bipolar transistors, thyristors and especially power devices operating at high voltages.

A semiconductor device as defined above is described in European Patent Application Publication No. 0115093. This device is constituted by a main (planar) junction enclosed by guard rings which permit increasing the breakdown voltage in the vicinity of the surface of the epitaxial surface layer deposited directly on the highly doped substrate. The thickness and the concentration c of this layer are determined in such a manner that the breakdown voltage through the layer is higher than the maximum operative voltage V and the resistance in the "on" state is a minimum. The structure of guard rings, that is to say their number, their width and their relative distance, is calculated as a function of the depth $x_j$ of the main pn junction, the concentration c of the epitaxial layer and the desired maximum operating voltage. This structure is reproduced on a doping mask which serves to form simultaneously the main pn junction and the floating guard rings.

SUMMARY OF THE INVENTION

Consequently, a specific mask corresponds to each particular semiconductor device, as a result of which the number of masks is considerably increased when a large variety of such devices is manufactured. The present invention has for its object to provide a semiconductor device as defined above, which could be adapted to a given structure of guard rings.

In accordance with the invention, a semiconductor device comprising a substrate of a first conductivity type having a high doping concentration $c_o$, a first epitaxial surface layer of said first conductivity type and having a lower doping concentration $c < c_o$, a surface adjacent zone of the second conductivity type opposite to the first conductivity type forming with said epitaxial surface layer a main planar pn junction having over the major part of its area a junction depth $x_j$, and a structure of floating guard rings of said second conductivity type is characterized in that between said substrate and said first epitaxial layer there is provided a second epitaxial layer having a doping concentration $c'$ such that $c_o > c' > c$.

Thus, when the thickness of the surface layer, the concentration $c'$ of the second epitaxial layer and its thickness are adjusted, it is possible with a given configuration of rings to design a semiconductor device operating at the desired maximum operating voltage and with an optimum resistance in the "on" state.

This is especially the case when manufacturing a class of devices of the same type having different maximum operating voltages. According to the invention, a class of semiconductor devices of the "planar" type comprising a highly doped substrate and an epitaxial surface layer having a carrier concentration c is obtained, in which are formed a main pn junction having a depth $x_j$ and a structure of floating guard rings, each device of the class being defined by a maximum operating voltage V, is characterized in that, a particular structure of floating guard rings having been determined for another device of the same type, designated as reference device, not belonging to the present class, constituted by a single epitaxial layer having a thickness $e_o$ and a concentration c and having a maximum operating voltage $V_m$ exceeding that of all the devices of the class, each device of the class also comprises on the one hand the particular structure of guard rings as the structure of guard rings and on the other hand between the substrate and the epitaxial surface layer a second epitaxial layer having a carrier concentration $c'$ exceeding c, the sum of the thickness e of the epitaxial surface layer and of the thickness $e'$ of the second epitaxial layer being at most equal to the thickness $e_o$.

Consequently, the invention consists in that a single structure of guard rings is defined for all the devices of the class, which can then be manufactured by means of a single mask, which provides the evident advantages of mass production.

The concentration $c'$ and the thicknesses e and $e'$ are more particularly determined by means of a first method of manufacturing the class of devices, which according to the invention is characterized in that for the reference device, in the case of a planar structure, the thickness $e_o$ and the concentration c of the single epitaxial layer are calculated in such a manner that the breakdown voltage through the layer is at least equal to the maximum operating voltage $V_m$ and that the resistance $R_{on}$ in the "on" state is a minimum, in that then the particular structure of floating guard rings associated with the main pn junction having a depth $x_j$ is determined, and in that for each device of the class the thicknesses e and $e'$, while maintaining $e + e' = e_o$, and the concentration $c'$ are calculated in such a manner that the breakdown voltage is at least equal to the nominal operating voltage V and that the resistance $R_{on}$ in the "on" state is a minimum.

This method has the advantage that it can be carried out in a simple manner to such an extent that the devices of the class have the same overall thickness as to their epitaxial layer and hence corcorespond to a standard epitaxial operation. However, the devices obtained by this method do not exhibit an optimum resistance $R_{on}$ due to the fact that the overall thickness $e_o$ is generally overdimensioned, especially for those of the components which have a low maximum operating voltage. In order to avoid this disadvantage, a second method according to the invention may be used, which is characterized in that for the reference device, in the case of a planar structure, the thickness $e_o$ and the concentration c of the single epitaxial layer are calculated in such a manner that the breakdown voltage through the layer is at least equal to the maximum operating voltage $V_m$, that the resistance $R_{on}$ in the "on" state is a minimum, in that then the particular structure of floating guard rings associated wth the main pn junction having a depth $x_j$ is determined, in that for each device first the concentration c' and an overall thickness $e'_o$ are calculated which permit for a single epitaxial structure having a concentration c' and a flat structure of obtaining a breakdown voltage at least equal to the maximum operating voltage V and a minimum resistance $R_{on}$ in the "on" state, and in that a value of the thickness e at least equal to the distance $d_1$ between the main junction and the first guard ring is fixed, the thickness e' then being chosen equal to $e'_o - e$.

BRIEF DESCRIPTION OF THE DRAWING

In order that the invention may be readily carried out, it will now be described more fully, by way of example, with reference to the accompanying drawing, in which.

DESCRIPTION OF THE PREFERRED EMBODIMENTS

Figure 1:
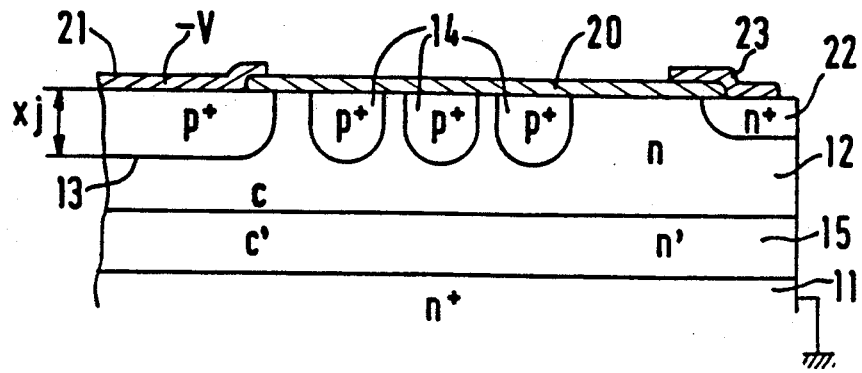
FIG. 1 is a sectional view of a semiconductor device according to the invention.

FIG. 1 is a sectional view of a semiconductor component of the "planar" type comprising a highly doped substrate 11, in this case of the n+ conductivity type, constituting, for example, the drain of an MOS transistor, and an epitaxial surface layer 12 having a carrier concentration c and in the case of FIG. 1 of the n-conductivity type. In this epitaxial layer 12 are formed a main pn junction 13 having a depth $x_j$ and a structure 14 of floating guard rings, which permit avoiding the breakdown at the surface when the polarization voltage, blocking the pn junction 13 increases; the depletion region traverses, in order of succession, each of the rings before the breakdown voltage is reached. The epitaxial surface layer 12 is coated more particularly with an oxide layer 20. The surface zone corresponding to the main junction 13 is covered by a metal electrode 21, to which a high negative voltage $-V$ with respect to the layer 12 is applied in order to polarize the pn junction 13. A supplementary safety feature is obtained due to an n+ ring 22 disposed at the periphery of the crystal in such a manner that the depletion region is prevented from reaching the edge of the crystal. A floating electrode 23 partly covers the ring 22 and the oxide layer 20.

Figure 2:
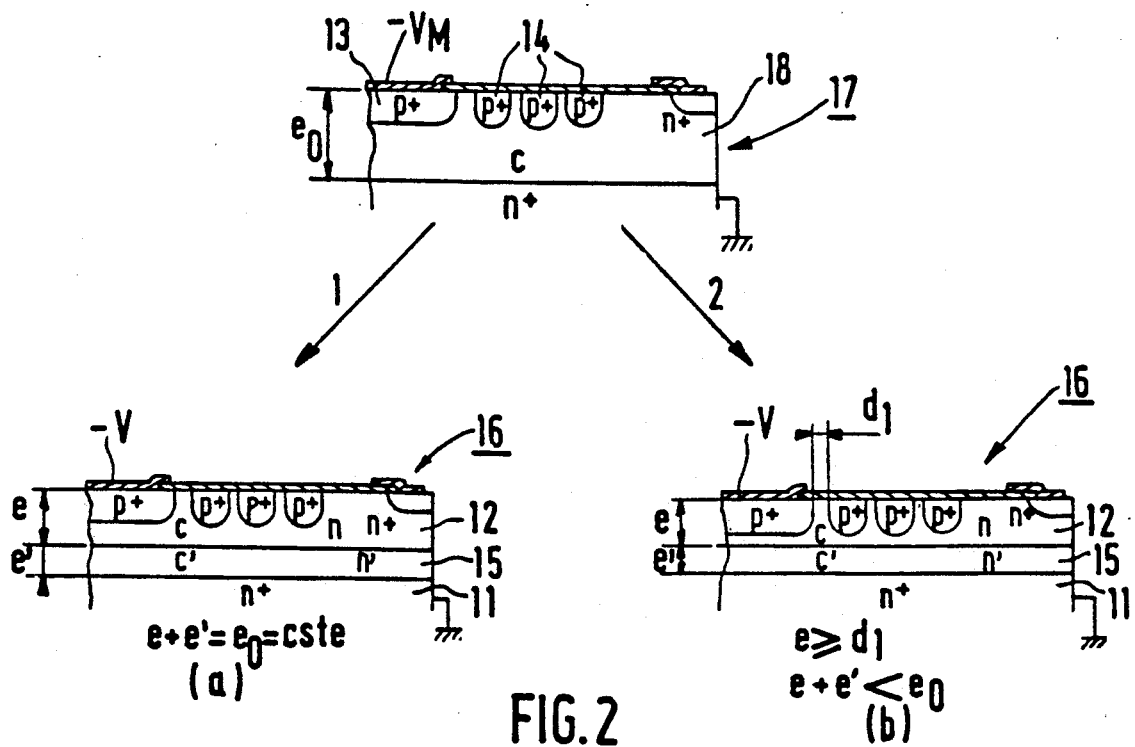
FIG. 2 is a sectional view of a reference device and of two devices belonging to two classes manufactured from the reference devices according to two method according to the invention.

As can be seen in FIG. 1, the semiconductor component also comprises between the substrate 11 and the epitaxial surface layer 12 a second epitaxial layer 15 having a carrier concentration c'. This configuration of two epitaxial layers having different concentrations permits, due to the fact that the concentrations and the thicknesses of the layers are given suitable values, obtaining a device having a given breakdown voltage and in the "on" state a minimum resistance $R_{on}$ when a structure of floating guard rings is provided for. More particularly, it can thus be envisaged to use only a single mask for the manufacture of a class of such devices, which differ from each other only by the value of their maximum operating voltage V. In this case, as shown in FIG. 2, a particular structure of floating guard rings is determined for another device of the same type, which is designated as reference device 17, which does not belong to the present class, is constituted by a single epitaxial layer 18 having a thickness $e_o$ and a concentration c and presents a maximum operating voltage $V_m$ higher than those of all the devices of the class. Each device 16 of the class then also presents on the one hand the particular structure of guard rings and has on the other hand, according to FIG. 1, a second epitaxial layer 15 situated between the substrate 11 and the surface layer 12. This second layer 15 has a carrier concentration c', higher than c, and its thickness e' is such that the sum $e + e'$ is at most equal to $e_o$.

FIG. 2(a) shows a device 16 of the class manufactured by means of a first method, which consists in that first for the reference device 17, in the case of a planar structure, the thickness $e_o$ and the concentration c of the single epitaxial layer 18 are calculated in such a manner that the breakdown voltage through the layer 12 is at least equal to the maximum operating voltage $V_m$ and that the resistance $R_{on}$ in the "on" state is a minimum. Subsequently, the particular structure of floating guard rings associated with the main pn junction 13 having a depth $x_j$ is determined. For each device 16 of the class the thicknesses e and e', while maintaining $e + e' = e_o$, and the concentration c' are then calculated in such a manner that the breakdown voltage is at least equal to the maximum operating voltage V and the resistance $R_{on}$ in the "on" state is a minimum. For these calculations, which are well known to those skilled in the art, reference is made to the earlier-mentioned European Application 115093, where at pages 10 and 11 the method of calculation and the relevant publications are described.

Figure 3:
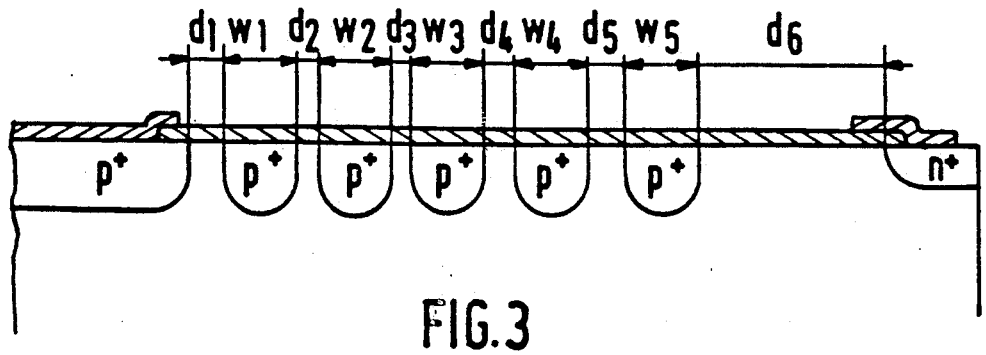
FIG. 3 is a sectional view of the definition of the parameters of a structure of guard rings.

The applicant has defined, for example, a reference device having a maximum operating voltage $V_m$ equal to 800 V by the following parameters:
$x_j = 6$ μm
$c_o = 80$ μm
$c = 10^{14}$ cm$^{-3}$
and the following ring structure (see FIG. 3)
$d_1 = 18$ μm
$d_2 = 20$ μm
$d_3 = 22$ μm  $W_1 = W_2 = W_3 = W_4 = 10$ μm
$d_4 = 25$ μm
$d_5 = 29$ μm  $W_5 = 7$ μm
$d_6 = 44$ μm.

The same ring structure can be used for obtaining a device having a maximum operating voltage V of 500 V defined by:
$c' = 2 \cdot 10^{14}$ cm$^{-3}$
$e = 20$ μm
$e' = 60$ μm, the overall duration of the epitaxy being the same in both cases.

The semiconductor device 16 of FIG. 2(b) is obtained by means of a second method, in which, after having determined the concentration c and the structure of guard rings for the reference device 17 in the same manner as for the first method, first for each device 16 of the class the concentration $c'$ and an overall thickness $e'_o$ are calculated, which permit, for a single epitaxial layer having a concentration $c'$ and a flat structure, obtaining a breakdown voltage at least equal to the maximum operating voltage V and a minimum resistance $R_{on}$ in the "on" state. Subsequently, a value of the thickness e at least equal to the distance $d_1$ between the main junction 13 and the first guard ring is fixed, the thickness $e'$ then being chosen equal to $e_o - e$ In general, this manufacturing method permits obtaining thinner layers and hence an even smaller resistance in the "on" state than by means of the first method.

More particularly, it is found that with the same ring structure a component having a maximum operating voltage of 500 V can be obtained with the following parameters:
$c = 10^{14} cm^{-3}$
$c' = 2 \cdot 10^{14} cm^{-3}$
$e = 40 \mu m$
$e' = 15 \mu m$.

The overall thickness of this device is 55 $\mu m$ instead of 80 $\mu m$ in the preceding embodiment and its resistance in the "on" state is lower.

What is claimed is:

1. A method of manufacturing a class of semiconductor devices of the planar type comprising a substrate of a first conductivity type having a high doping concentration $c_o$, a first epitaxial surface layer of said first conductivity type and having a lower doping concentration $c < c_o$, a surface adjacent zone of the second conductivity type opposite to the first conductivity type and forming with said epitaxial surface layer a main planar pn junction having, over the major part of its area, a junction depth $x_j$, and a structure of floating guard rings of said second conductivity type, between said substrate and said first epitaxial layer there being provided a second epitaxial layer having a doping concentration $c'$ such that $c_o > c' > c$, each device of the class being defined by a particular maximum operating voltage V, all the devices of the class having the same structure of guard rings, said structure of guard rings having been determined for a reference device not belonging to the class, constituted by a single epitaxial layer having a thickness $e_o$, a doping concentration c and a maximum operating voltage $V_m$ exceeding the maximum operating voltage V of all the devices of the class, the sum of the thickness e of the epitaxial surface layer and the thickness $e'$ of the second epitaxial layer of all the devices of the class being at most equal to the thickness $e_o$, said method comprising the steps of calculating, for said reference device, in the case of a planar structure, the thickness $e_o$ and the concentration c of the single epitaxial layer in such a manner that the breakdown voltage through the layer is at least equal to the maximum operating voltage $V_m$ and the resistance $R_{on}$ in the "on" state is a minimum, providing the particular structure of floating guard rings associated with the main pn junction having a depth $x_j$, and providing, for each component of the class, the epitaxial surface layer and the second epitaxial layer of thicknesses e and $e'$, respectively, while maintaining $e + e' = e_o$, and providing said second epitaxial layer with said doping concentration $c'$ such that the breakdown voltage is at least equal to the maximum operating voltage V and the resistance $R_{on}$ in the "on" state is a minimum.

2. A method of manufacturing a class of semiconductor devices as claimed in claim 1, characterized in that for said reference component, in the case of a planar structure, the thickness $e_o$ and the concentration c of the single epitaxial layer are provided in such a manner that the breakdown voltage through the layer is at least equal to the maximum operating voltage $V_m$ and the resistance $R_{on}$ in the "on" state is a minimum, in that said particular structure of floating guard rings associated with the main pn junction having a depth $x_j$ is then determined, in that for each device of the class first the concentration $c'$ and an overall thickness $e'_o$ are determined, to permit, for a single epitaxial layer having a concentration $c'$ and a planar structure, obtaining a breakdown voltage at least equal to the maximum operating voltage V and the minimum resistance $R_{on}$ in the "on" state, and in that a value of the thickness e at least equal to the distance $d_1$ between the main junction and the first guard ring is fixed, the thickness $e'$ then being chosen equal to $e'_o - e$.

* * * * *